(12) United States Patent
Lee

(10) Patent No.: US 11,237,799 B2
(45) Date of Patent: Feb. 1, 2022

(54) PROCESSING-IN-MEMORY (PIM) DEVICES AND METHODS OF TESTING THE PIM DEVICES

(71) Applicant: SK hynix Inc., Icheon-si (KR)

(72) Inventor: Jeong Jun Lee, Gwangju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/940,773

(22) Filed: Jul. 28, 2020

(65) Prior Publication Data

US 2021/0132909 A1 May 6, 2021

(30) Foreign Application Priority Data

Oct. 30, 2019 (KR) .......................... 10-2019-0136529

(51) Int. Cl.
*G06F 7/544* (2006.01)
*G06F 7/523* (2006.01)
*G06G 7/16* (2006.01)
*G06F 7/501* (2006.01)

(52) U.S. Cl.
CPC ............ *G06F 7/5443* (2013.01); *G06F 7/501* (2013.01); *G06F 7/523* (2013.01); *G06G 7/16* (2013.01)

(58) Field of Classification Search
CPC ...... G06F 7/523; G06F 7/5443; G06F 7/5324; G06G 7/16
See application file for complete search history.

(56) References Cited

U.S. PATENT DOCUMENTS

| | | | | |
|---|---|---|---|---|
| 6,483,343 | B1 * | 11/2002 | Faith ................ | H03K 19/17732 326/38 |
| 2003/0222879 | A1 * | 12/2003 | Lin .......................... | G06F 7/57 345/530 |
| 2005/0187999 | A1 | 8/2005 | Zheng et al. | |
| 2021/0089390 | A1 * | 3/2021 | Lee ........................... | G06F 7/50 |

FOREIGN PATENT DOCUMENTS

CN          103984519 A  *  8/2014  ........... G06F 7/4876

* cited by examiner

*Primary Examiner* — Matthew D Sandifer
(74) *Attorney, Agent, or Firm* — William Park & Associates Ltd.

(57) ABSTRACT

A processing-in-memory (PIM) device includes a multiplication/accumulation (MAC) operator. The MAC operator includes a multiplying block and an adding block. The multiplying block includes a first multiplier and a second multiplier. The first multiplier performs a first multiplying calculation of first half data of first data and first half data of second data. The second multiplier performs a second multiplying calculation of second half data of the first data and second half data of the second data. The adding block performs an adding calculation of first multiplication result data outputted from the first multiplier and second multiplication result data outputted from the second multiplier. The MAC operator receives a test mode signal having a first level to perform a test operation for the multiplying block.

13 Claims, 24 Drawing Sheets

PROCESSING-IN-MEMORY (PIM) DEVICES AND METHODS OF TESTING THE PIM DEVICES

CROSS-REFERENCE TO RELATED APPLICATIONS

The present application claims priority under 35 U.S.C. 119(a) to Korean Application No. 10-2019-0136529, filed on Oct. 30, 2019, which is incorporated herein by reference in its entirety.

BACKGROUND

1. Technical Field

Various embodiments of the disclosed technology relate to processing-in-memory (PIM) devices and methods of testing the PIM devices.

2. Related Art

Recently, interest in artificial intelligence (AI) has been increasing not only in the information technology industry but also in the financial and medical industries. Accordingly, in various fields, the artificial intelligence, more precisely, the introduction of deep learning is considered and prototyped. In general, techniques for effectively learning deep neural networks (DNNs) or deep networks having the increased layers as compared with general neural networks to utilize the deep neural networks (DNNs) or the deep networks in pattern recognition or inference are commonly referred to as the deep learning.

One of backgrounds or causes of this widespread interest may be due to the improved performance of a processor performing arithmetic operations. To improve the performance of the artificial intelligence, it may be necessary to increase the number of layers constituting a neural network in the artificial intelligence to educate the artificial intelligence. This trend has continued in recent years, which has led to an exponential increase in the amount of computation required for the hardware that actually does the computation. Moreover, if the artificial intelligence employs a general hardware system including a memory and a processor which are separated from each other, the performance of the artificial intelligence may be degraded due to limitation of the amount of data communication between the memory and the processor. In order to solve this problem, a PIM device in which a processor and a memory are integrated in one semiconductor chip has been used as a neural network computing device. Because the PIM device directly performs arithmetic operations in the PIM device, a data processing speed in the neural network may be improved.

SUMMARY

According to an embodiment, there is provided a PIM device including a multiplication/accumulation (MAC) operator integrated in a memory device. The MAC operator includes a multiplying block and an adding block. The multiplying block includes a first multiplier and a second multiplier. The first multiplier is configured to perform a first multiplying calculation of first half data of first data and first half data of second data which are inputted to respective ones of two first input terminals of the first multiplier, and the second multiplier is configured to perform a second multiplying calculation of second half data of the first data and second half data of the second data which are inputted to respective ones of two second input terminals of the second multiplier. The adding block is configured to perform an adding calculation of first multiplication result data outputted from the first multiplier and second multiplication result data outputted from the second multiplier. The MAC operator is configured to receive a test mode signal having a first level to perform a test operation for the multiplying block by inputting the first half data of the first data and the first half data of the second data to respective ones of the two first input terminals and to respective ones of the two second input terminals and by executing the first multiplying calculation, the second multiplying calculation, and the adding calculation.

According to another embodiment, there is provided a PIM device including a multiplication/accumulation (MAC) operator integrated in a memory device. The MAC operator includes a multiplying block and an adding block. The multiplying block performs a multiplying calculation of first data and second data to output multiplication result data. The adding block performs an adding calculation of the multiplication result data outputted from the multiplying block. The multiplication result data outputted from the multiplying block are directly outputted from the PIM device through a data input/output (I/O) block when a test mode signal has a first level.

According to yet another embodiment, there is provided a method of testing a processing-in-memory (PIM) device including a multiplication/accumulation (MAC) operator integrated in a memory device. The method includes generating a test mode signal having a first level for activating a test arithmetic mode, inputting a portion of first data and a portion of second data to each of a plurality of multipliers included in the MAC operator in response to the test mode signal having the first level, and performing an exclusive OR operation of multiplication result data outputted from the plurality of multipliers to execute a test operation for the plurality of multipliers in response to the test mode signal having the first level.

According to still another embodiment, there is provided a method of testing a processing-in-memory (PIM) device including a multiplication/accumulation (MAC) operator integrated in a memory device. The method includes performing a multiplying calculation of first data and second data inputted to a multiplying block included in the MAC operator to generate multiplication result data, generating a test mode signal having a first level for activating a test arithmetic mode, and directly outputting the multiplication result data from the PIM device through a data input/output (I/O) block in response to the test mode signal having the first level.

BRIEF DESCRIPTION OF THE DRAWINGS

Certain features of the disclosed technology are illustrated by various embodiments with reference to the attached drawings, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on," "over," "above," "under," or "beneath" another element, it is intended to mean relative position relationship, but not used to limit certain cases that the element directly contacts the other element, or at least one intervening element is present therebetween. Accordingly, the terms such as "on," "over/" "above," "under/" "beneath," "below," and the like that are used herein are for the purpose of describing particular embodiments only and are not intended to limit the scope of the present disclosure. Further, when an element is referred to as being "connected" or "coupled" to another element, the element may be to electrically or mechanically connected or coupled to the other element directly, or may form a connection relationship or coupling relationship by replacing the other element therebetween.

Various embodiments are directed to PIM devices.

Figure 1:
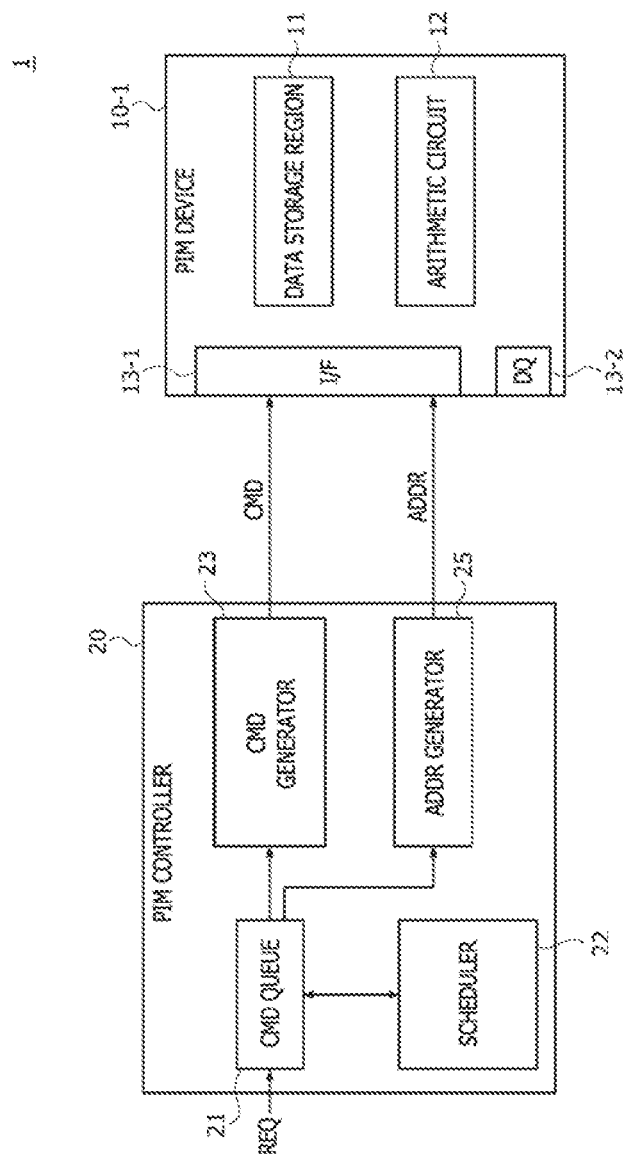
FIG. 1 is a block diagram illustrating a PIM system according to the present disclosure.

FIG. 1 is a block diagram illustrating a PIM system according to the present disclosure. As illustrated in FIG. 1, the PIM system 1 may include a PIM device 10-1 and a PIM controller 20. The PIM device 10-1 may include a data storage region 11, arithmetic circuit 12, an interface (I/F) 13-1, and a data input/output (I/O) pad 13-2. The data storage region 1 may include a first storage region and a second storage region. In an embodiment, the first storage region and the second storage region may be memory bank, respectively. In another embodiment, the first data storage region and the second storage region may be memory bank and buffer memory, respectively. The data storage region may include a volatile memory element or a non-volatile memory element. The data storage region may include both the volatile memory element and the non-volatile memory element.

The arithmetic circuit 12 may perform an arithmetic operation of the data transferred from the data storage region 11. In an embodiment, the arithmetic circuit 12 may include a multiplying-and-accumulating (MAC) operator. The MAC operator may perform a multiplying calculation of the data transferred from the data storage region 11 and perform an accumulating calculation of the multiplication result data. After MAC operating, the MAC operator may output a MAC result data. The MAC result data may store the data storage region 11 or output from the PIM device 10-1 through the data I/O pad 13-2.

The interface 13-1 of the PIM device 10-1 may receive a command CMD and address ADDR from the PIM controller 20. The interface 13-1 may output the command CMD to the data storage region 11 or the arithmetic circuit 12 in the PIM device 10-1. The interface 13-1 may output the address ADDR to the data storage region 11 in the PIM device 10-1. The data I/O pad 13-2 of the PIM device 10-1 may function as a data communication terminal between an external device of the PIM device 10-1, for example the PIM controller 20 and the data storage region 11 included in the PIM device 10-1. The external device of the PIM device 10-1 may correspond to the PIM controller 20 of the PIM system 1 or a host located outside the PIM system 1. Accordingly, data outputted from the host or the PIM controller 20 may be inputted into the PIM device 10-1 through the data I/O pad 13-2.

The PIM controller 20 may control operations of the PIM device 10-1. In an embodiment, the PIM controller 20 may control the PIM device 10-1 such that the PIM device 10-1 operates in a memory mode or a MAC mode. In the event that the PIM controller 20 controls the PIM device 10-1 such that the PIM device 10-1 operates in the memory mode, the PIM device 10-1 may perform a data read operation or a data write operation for the data storage region 11. In the event that the PIM controller 20 controls the PIM device 10-1 such that the PIM device 10-1 operates in the MAC mode, the PIM device 10-1 may perform a MAC operation for the arithmetic circuit 12. In the event that the PIM controller 20 controls the PIM device 10-1 such that the PIM device 10-1 operates in the MAC mode, the PIM device 10-1 may also perform the data read operation and the data write operation for the data storage region 11 to execute the MAC operation.

The PIM controller 20 may be configured to include a command queue logic 21, a scheduler 22, a command generator 23, and an address generator 25. The command queue logic 21 may receive a request REQ from an external device (e.g., a host of the PIM system 1) and store the command queue corresponding to the request REQ in the command queue logic 21. The command queue logic 21 may transmit information on a storage status of the command queue to the scheduler 22 whenever the command queue logic 21 stores the command queue. The commands queues stored in the command queue logic 21 may be transmitted to the command generator 23 according to a sequence determined by the scheduler 22.

The scheduler 22 may adjust a sequence of the command queue when the command queue stored in the command queue logic 21 is outputted from the command queue logic 21. In order to adjust the output sequence of the command queue stored in the command queue logic 21, the scheduler 22 may analyze the information on the storage status of the command queue provided by the command queue logic 21 and may readjust a process sequence of the command queue such that the command queue is processed according to a proper sequence.

The command generator 23 may receive the command queue related to the memory mode of the PIM device 10-1 the MAC mode of the PIM device 10-1 from the command queue logic 21. The command generator 23 may decode the command queue to generate and output the command CMD. The command CMD may include a memory command for the memory mode or a MAC command for the MAC mode. The command CMD outputted from the command generator 23 may be transmitted to the PIM device 10-1.

The address generator 25 may receive address information from the command queue logic 21 and generate the address ADDR for accessing to a region in the data storage region 11. In an embodiment, the address ADDR may include a bank address, a row address, and an column address. The address ADDR outputted from the address generator 25 may be inputted to the data storage region 11 through the interface (I/F) 13-1.

Figure 2:
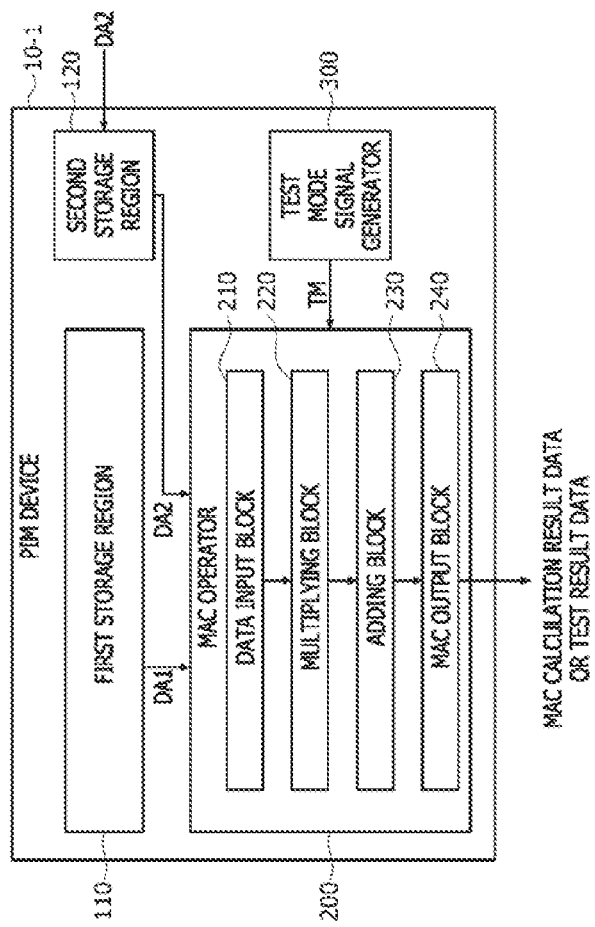
FIG. 2 is a block diagram illustrating a configuration of a PIM device according to an embodiment of the present disclosure.

FIG. 2 is a block diagram illustrating a configuration of a PIM device 10-1 according to an embodiment of the present disclosure. The PIM device 10-1 may be configured to include a first storage region 110, a second storage region 120, a MAC operator 200, and a test mode signal generator 300. In an embodiment, the PIM device 10-1 may be applied to a neural network circuit. In such a case, vector data necessary to neural network calculation may be stored in the first storage region 110, and weight data may be temporarily stored in the second storage region 120. In an embodiment, while the first storage region 110 may be a memory region (e.g., a bank) of the PIM device 10-1, the second storage region 120 may be a buffer memory which is distinguished from the memory region (e.g., a bank) of the PIM device 10-1. In an embodiment, the first storage region 110 may be realized using a volatile memory device such as a DRAM device or an SRAM device. In another embodiment, the first storage region 110 may be realized using a nonvolatile memory device. In yet another embodiment, the first storage region 110 may include both a volatile memory device and a nonvolatile memory device.

The MAC operator 200 may perform a MAC calculation in an arithmetic mode of the PIM device 10-1. That is, the MAC operator 200 may perform a MAC calculation of first data DA1 outputted from the first storage region 110 and second data DA2 outputted from the second storage region 120 in the arithmetic mode of the PIM device 10-1. The MAC operator 200 does not perform any MAC calculation in a memory mode of the PIM device 10-1. That is, in the memory mode of the PIM device 10-1, the PIM device 10-1 may function as a general memory device. Thus, in the memory mode of the PIM device 10-1, the PIM device 10-1 may store write data into the first storage region 110 or may read out read data from the first storage region 110 to output the read data to an external device.

In an embodiment, the MAC operator 200 may include a data input block 210, a multiplying block 220, an adding block 230, and a MAC output block 240. The data input block 210 may receive the first data DA1 from the first storage region 110 and the second data DA2 from the second storage region 120. The data input block 210 may output the first data DA1 and the second data DA2 as they are to the multiplying block 220 or may convert the first data DA1 and the second data DA2 into a data form used in a test mode to output the converted data of the first data DA1 and the second data DA2 to the multiplying block 220. The multiplying block 220 may perform a multiplying calculation of the data outputted from the data input block 210 to output the multiplication result data to the adding block 230. The adding block 230 may perform an adding calculation of the multiplication result data outputted from the multiplying block 220 and may output the addition result data to the MAC output block 240. The MAC output block 240 may output the addition result data outputted from the adding block 230 as they are or may perform a series of calculations according to the test mode to generate and output test result data.

The test mode signal generator 300 may generate a test mode signal TM having a first level (e.g., a logic "high" level) during a test operation for the multiplying block 220 and the adding block 230 of the MAC operator 200. In contrast, the test mode signal generator 300 may generate the test mode signal TM having a second level (e.g., a logic "low" level) during a normal arithmetic mode of the arithmetic mode which is not the test mode. The test mode signal TM outputted from the test mode signal generator 300 may be inputted to the MAC operator 200. In an embodiment, when the test mode signal TM having the first level is inputted to the MAC operator 200, the data input block 210 and the MAC output block 240 may operate in the test mode. In contrast, when the test mode signal TM having the second level is inputted to the MAC operator 200, the data input block 210 and the MAC output block 240 may operate in the normal arithmetic mode.

Figure 3:
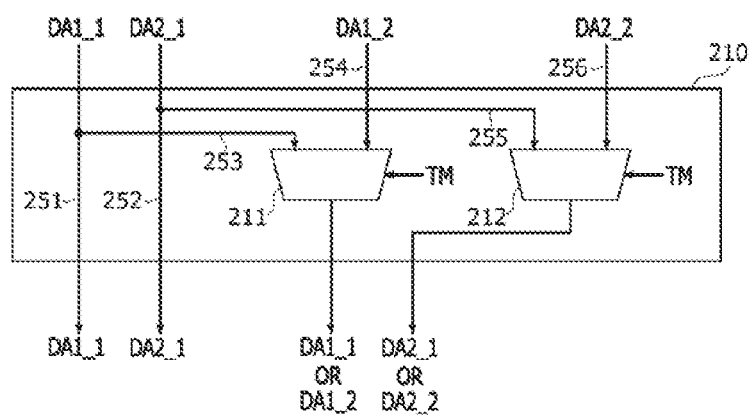
FIG. 3 is a schematic view illustrating a configuration of a data input block included in the PIM device of FIG. 2.

FIG. 3 is a schematic view illustrating a configuration of the data input block 210 included in the MAC operator 200 of the PIM device 10-1 shown in FIG. 2. Referring to FIG. 3, the data input block 210 may receive the first data DA1 and the second data DA2 from respective ones of the first and second storage regions 110 and 120. In an embodiment, each of the first data DA1 and the second data DA2 may be an 'N'-bit binary stream. In the present embodiment, it may be assumed that a burst length is 'N/2.' In such a case, the first data DAT1 having 'N' bits may be divided into a first half ('N/2'-bit) data DA1_1 of the first data DA1 and a second half ('N/2'-bit) data DA1_2 of the first data DA1. The first half ('N/2'-bit) data DA1_1 of the first data DA1 may include low-order bits of the first data DA1, and the second half ('N/2'-bit) data DA1_2 of the first data DA1 may include high-order bits of the first data DA1. Similarly, the second data DAT2 having 'N' bits may be divided into a first half ('N/2'-bit) data DA2_1 of the second data DA2 and a second half ('N/2'-bit) data DA2_2 of the second data DA2. The first half ('N/2'-bit) data DA2_1 of the second data DA2 may include low-order bits of the second data DA2, and the second half ('N/2'-bit) data DA2_2 of the second data DA2 may include high-order bits of the second data DA2.

The data input block 210 may include a first direct transmission line 251 (also, referred to as a first I/O line) and a second direct transmission line 252 (also, referred to as a second I/O line). The first direct transmission line 251 may be connected to an input line of the first half ('N/2'-bit) data DA1_1 of the first data DA1. The first half ('N/2'-bit) data DA1_1 of the first data DA1 inputted to the data input block 210 may be outputted from the data input block 210 through the first direct transmission line 251 without any modification. The second direct transmission line 252 may be connected to an input line of the first half ('N/2'-bit) data DA2_1 of the second data DA2. The first half ('N/2'-bit) data DA2_1 of the second data DA2 inputted to the data input block 210 may be outputted from the data input block 210 through the second direct transmission line 252 without any modification. The first half ('N/2'-bit) data DA1_1 of the first data DA1 and the first half ('N/2'-bit) data DA2_1 of the second data DA2 outputted from the data input block 210 through the first and second direct transmission lines 251 and 252 may be inputted to the multiplying block 220 of the MAC operator 200.

The data input block 210 may include a first multiplexer 211 and a second multiplexer 212. The first multiplexer 211 may have two input terminals and one output terminal. Similarly, the second multiplexer 212 may also have two input terminals and one output terminal. One of the two input terminals of the first multiplexer 211 may be coupled to a first internal transmission line 253. The first internal transmission line 253 may be branched from the first direct transmission line 251. Thus, the first half ('N/2'-bit) data DA1_1 of the first data DA1 may be inputted to one of the two input terminals of the first multiplexer 211. The other one of the two input terminals of the first multiplexer 211 may be coupled to an input line 254 of the second half ('N/2'-bit) data DA1_2 of the first data DA1. Thus, the second half ('N/2'-bit) data DA1_2 of the first data DA1 may be inputted to the first multiplexer 211 through the other one of the two input terminals of the first multiplexer 211. One of the two input terminals of the second multiplexer 212 may be coupled to a second internal transmission line 255. The second internal transmission line 255 may be branched from the second direct transmission line 252. Thus, the first half ('N/2'-bit) data DA2_1 of the second data DA2 may be inputted to the second multiplexer 212 through one of the two input terminals of the second multiplexer 212. The other one of the two input terminals of the second multiplexer 212 may be coupled to an input line 256 of the second half ('N/2'-bit) data DA2_2 of the second data DA2. Thus, the second half ('N/2'-bit) data DA2_2 of the second data DA2 may be inputted to the second multiplexer 212 through the other one of the two input terminals of the second multiplexer 212.

The first multiplexer 211 may output the first half ('N/2'-bit) data DA1_1 of the first data DA1 or the second half ('N/2'-bit) data DA1_2 of the first data DA1 in response to the test mode signal TM outputted from the test mode signal generator 300. The second multiplexer 212 may output the first half ('N/2'-bit) data DA2_1 of the second data DA2 or the second half ('N/2'-bit) data DA2_2 of the second data DA2 in response to the test mode signal TM outputted from the test mode signal generator 300. A timing of when the test mode signal TM is inputted to the first multiplexer 211 may be substantially the same as a timing of when the test mode signal TM is inputted to the second multiplexer 212. That is, the first and second multiplexers 211 and 212 may be synchronized with the same clock signal to simultaneously receive the test mode signal TM.

The arithmetic mode of the PIM device 10-1 may include the normal arithmetic mode and a test arithmetic mode. In the test arithmetic mode, the PIM device 10-1 may test an arithmetic function of the MAC operator 200. In the normal arithmetic mode, the PIM device 10-1 may perform a general arithmetic operation. In an embodiment, the test mode signal TM having the first level may be inputted to the data input block 210 in the test arithmetic mode of the arithmetic mode of the PIM device 10-1. In contrast, the test mode signal TM having the second level may be inputted to the data input block 210 in the normal arithmetic mode of the arithmetic mode of the PIM device 10-1. If the test mode signal TM having the first level is inputted to the data input block 210, then the first multiplexer 211 may output the first half ('N/2'-bit) data DA1_1 of the first data DA1 and the second multiplexer 212 may output the first half ('N/2'-bit) data DA2_1 of the second data DA2. If the test mode signal TM having the second level is inputted to the data input block 210, then the first multiplexer 211 may output the second half ('N/2'-bit) data DA1_2 of the first data DA1 and the second multiplexer 212 may output the second half ('N/2'-bit) data DA2_2 of the second data DA2.

Figure 4:
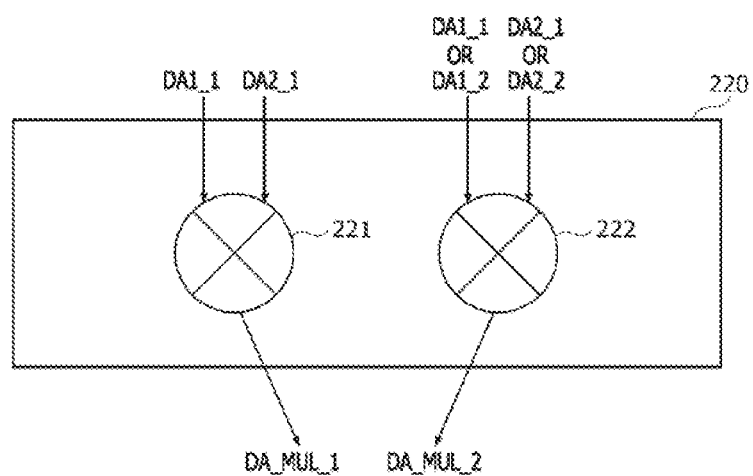
FIG. 4 is a schematic view illustrating a configuration of a multiplying block included in the PIM device of FIG. 2.

FIG. 4 is a schematic view illustrating a configuration of the multiplying block 220 included in the MAC operator 200 of the PIM device 10-1 shown in FIG. 2. Referring to FIG. 4, the multiplying block 220 may include a first multiplier 221 and a second multiplier 222. The first multiplier 221 may receive the first half ('N/2'-bit) data DA1_1 of the first data DA1 and the first half ('N/2'-bit) data DA2_1 of the second data DA2 from the data input block 210. The second multiplier 222 may receive the first half ('N/2'-bit) data DA1_1 of the first data DA1 and the first half ('N/2'-bit) data DA2_1 of the second data DA2 from the data input block 210 or may receive the second half ('N/2'-bit) data DA1_2 of the first data DA1 and the second half ('N/2'-bit) data DA2_2 of the second data DA2 from the data input block 210. In the test arithmetic mode, the second multiplier 222 may receive the first half ('N/2'-bit) data DA1_1 of the first data DA1 and the first half ('N/2'-bit) data DA2_1 of the second data DA2 from the data input block 210. In the normal arithmetic mode, the second multiplier 222 may receive the second half ('N/2'-bit) data DA1_2 of the first data DA1 and the second half ('N/2'-bit) data DA2_2 of the second data DA2 from the data input block 210.

The first multiplier 221 may perform a multiplying calculation of the first half ('N/2'-bit) data DA1_1 of the first data DA1 and the first half ('N/2'-bit) data DA2_1 of the second data DA2 in the arithmetic mode regardless of the test arithmetic mode or the normal arithmetic mode. The first multiplier 221 may output the multiplication result data as first multiplication result data DA_MUL_1. The first multiplication result data DA_MUL_1 may have 'N' bits because the first half ('N/2'-bit) data DA1_1 of the first data DA1 are 'N/2'-bit data and the first half ('N/2'-bit) data DA2_1 of the second data DA2 are 'N/2'-bit data. In the test arithmetic mode, the second multiplier 222 may perform a multiplying calculation of the first half ('N/2'-bit) data DA1_1 of the first data DA1 and the first half ('N/2'-bit) data DA2_1 of the second data DA2. The second multiplier 222 may output the multiplication result data as second multiplication result data DA_MUL_2. The second multiplication result data DA_MUL_2 may also have 'N' bits. In the test arithmetic mode, the first multiplication result data DA_MUL_1 may be normally identical to the second multiplication result data DA_MUL_2 because the first and second multipliers 221 and 222 receive the same data. In the normal arithmetic mode, the second multiplier 222 may perform a multiplying calculation of the second half ('N/2'-bit) data DA1_2 of the first data DA1 and the second half ('N/2'-bit) data DA2_2 of the second data DA2. The second multiplier 222 may output the multiplication result data as the second multiplication result data DA_MUL_2.

Figure 5:
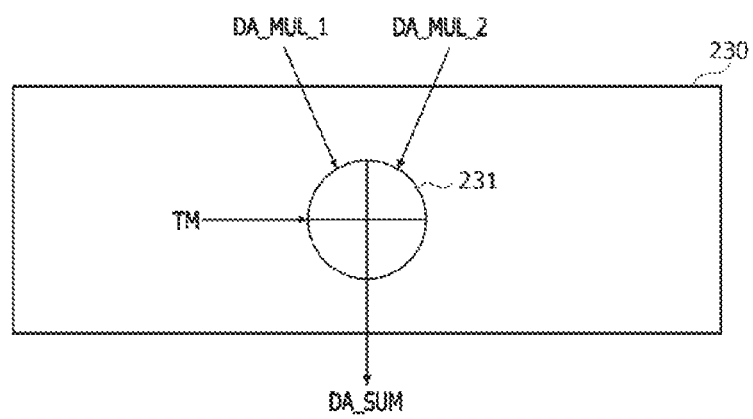
FIG. 5 is a schematic view illustrating a configuration of an adding block included in the PIM device of FIG. 2.

FIG. 5 is a schematic view illustrating a configuration of the adding block 230 included in the MAC operator 200 of the PIM device 10-1 shown in FIG. 2. Referring to FIG. 5, the adding block 230 may include an adder 231. The adder 231 may receive the first multiplication result data DA_MUL_1 from the first multiplier 221 and the second multiplication result data DA_MUL_2 from the second multiplier 222. The adder 231 may also receive the test mode signal TM. In an embodiment, when the test mode signal TM having the first level is inputted to the adder 231 in the test arithmetic mode, the adder 231 may be configured to perform an exclusive OR operation. In addition, when the test mode signal TM having the second level is inputted to the adder 231 in the normal arithmetic mode, the adder 231 may be configured to perform an operation of a full-adder. In the normal arithmetic mode, the adder 231 may perform a general adding calculation of the first multiplication result data DA_MUL_1 and the second multiplication result data DA_MUL_2 and may output the result of the adding calculation as addition result data DA_SUM.

In the test arithmetic mode, the adder 231 may perform an exclusive OR operation of the first multiplication result data DA_MUL_1 and the second multiplication result data DA_MUL_2 and may output the result of the exclusive OR operation as the addition result data DA_SUM. The addition result data DA_SUM may be configured to have 'N+1' bits including a carry bit. In the test arithmetic mode, the addition result data DA_SUM outputted from the adder 231 may have the first level (i.e., a logic "low" level) when the first multiplication result data DA_MUL_1 and the second multiplication result data DA_MUL_2 are the same data. In contrast, when the first multiplication result data DA_MUL_1 are different from the second multiplication result data DA_MUL_2, the addition result data DA_SUM outputted from the adder 231 may have the second level (i.e., a logic "high" level). As described with reference to FIG. 4, the first multiplication result data DA_MUL_1 outputted from the first multiplier 221 may be the same data as the second multiplication result data DA_MUL_2 outputted from the second multiplier 222 in the test arithmetic mode. Thus, when the first and second multipliers 221 and 222 perform normal multiplying calculations, the addition result data DA_SUM may be generated to have the first level by the adder 231.

Figure 6:
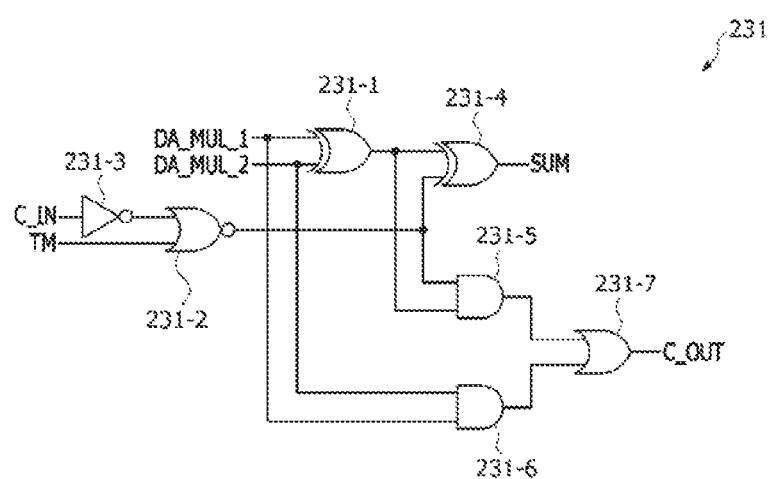
FIG. 6 is a circuit diagram illustrating a configuration of an adder constituting the adding block shown in FIG. 5.

FIG. 6 is a circuit diagram illustrating a configuration of the adder 231 constituting the adding block 230 shown in FIG. 5. Referring to FIG. 6, the adder 231 may be configured to include an inverter 231-3 and a NOR gate 231-2 in addition to a full-adder. The full-adder may be configured to include a first exclusive OR gate 231-1, a second exclusive OR gate 231-4, a first AND gate 231-5, a second AND gate 231-6, and an OR gate 231-7. The inverter 231-3 may invert a level of a carry input signal C_IN to output an inverted signal of the carry input signal C_IN to the NOR gate 231-2. The NOR gate 231-2 may perform a logical NOR operation of an output signal of the inverter 231-3 and the test mode signal TM to output a result of the logical NOR operation.

The first exclusive OR gate 231-1 may perform an exclusive OR operation of the first multiplication result data DA_MUL_1 outputted from the first multiplier 221 and the second multiplication result data DA_MUL_2 outputted from the second multiplier 222 to output a result of the exclusive OR operation. The second exclusive OR gate 231-4 may perform an exclusive OR operation of an output signal of the first exclusive OR gate 231-1 and an output signal of the NOR gate 231-2 to generate and output addition data SUM. The addition data SUM may correspond to data that except a carry output bit from the addition result data DA_SUM outputted from the adder 231. The first AND gate 231-5 may perform a logical AND operation of an output signal of the first exclusive OR gate 231-1 and an output signal of the NOR gate 231-2 to output a result of the logical AND operation. The second AND gate 231-6 may perform a logical AND operation of the first multiplication result data DA_MUL_1 outputted from the first multiplier 221 and the second multiplication result data DA_MUL_2 outputted from the second multiplier 222 to output a result of the logical AND operation. The OR gate 321-7 may perform a logical OR operation of an output signal of the first AND gate 231-5 and an output signal of the second AND gate 231-6 to output a result of the logical OR operation as carry output data C_OUT.

In the test arithmetic mode, the test mode signal TM inputted to the NOR gate 231-2 may have the first level (i.e., a logic "high" level), and the NOR gate 231-2 may output a signal having the second level (i.e., a logic "low" level) regardless of a level of the carry input signal C_IN. Thus, in the test arithmetic mode, a signal having the second level (i.e., a logic "low" level) may be inputted to the second exclusive OR gate 231-4 and the first AND gate 231-5. As described with reference to FIG. 4, in the test arithmetic mode, the first multiplication result data DA_MUL_1 outputted from the first multiplier 221 may be the same data as the second multiplication result data DA_MUL_2 outputted from the second multiplier 222. Thus, when the first and second multipliers 221 and 222 normally operate, an output signal of the first exclusive OR gate 231-1 may have the second level (i.e., a logic "low" level). In such a case, the second exclusive OR gate 231-4 may receive two input signals having the second level (i.e., a logic "low" level) to output the addition data SUM having the second level (i.e., a logic "low" level). In contrast, when the first and second multipliers 221 and 222 abnormally operate, the first multiplication result data DA_MUL_1 outputted from the first multiplier 221 may be different from the second multiplication result data DA_MUL_2 outputted from the second multiplier 222. Thus, an output signal of the first exclusive OR gate 231-1 may have the first level (i.e., a logic "high" level). In such a case, the second exclusive OR gate 231-4 may receive two input signals having different levels to output the addition data SUM having the first level (i.e., a logic "high" level). As a result, in the test arithmetic mode, the adder 231 may perform an exclusive OR operation that outputs the addition data SUM having the second level (i.e., a logic "low" level) when the first multiplication result data DA_MUL_1 are the same data as the second multiplication result data DA_MUL_2 and outputs the addition data SUM having the first level (i.e., a logic "high" level) when the first multiplication result data DA_MUL_1 are different from the second multiplication result data DA_MUL_2.

In the normal arithmetic mode, the NOR gate 231-2 may receive an inverted signal of the carry input signal C_IN and the test mode signal TM having the second level (i.e., a logic "low" level). Thus, the NOR gate 231-2 may output a signal having the second level (i.e., a logic "low" level) when the carry input signal C_IN has the second level (i.e., a logic "low" level) and may output a signal having the first level (i.e., a logic "high" level) when the carry input signal C_IN has the first level (i.e., a logic "high" level). That is, in the normal arithmetic mode, the NOR gate 231-2 may output the carry input signal C_1N as it is. Because the carry input signal C_IN is inputted to both of the second exclusive OR gate 231-4 and the first AND gate 231-5, the adder 231 may output a result of an adding operation of the first multiplication result data DA_MUL_1, the second multiplication result data DA_MUL_2, and the carry input signal C_IN as the addition data SUM and the carry output data C_OUT.

Figure 7:
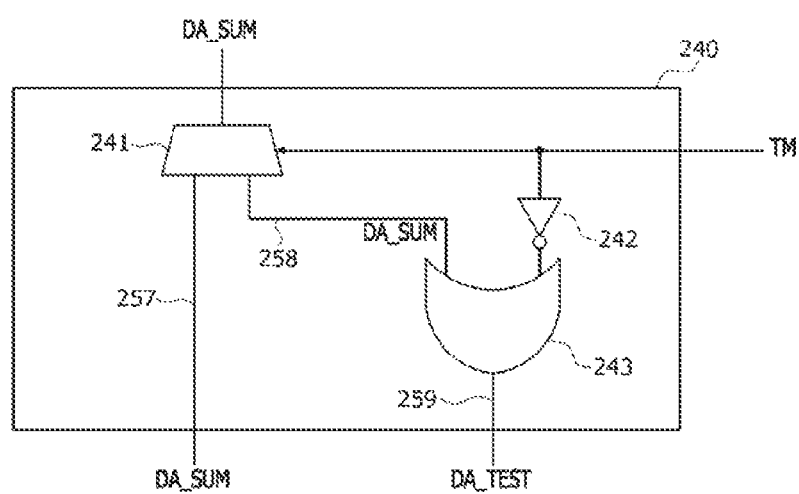
FIG. 7 is a schematic view illustrating a configuration of a multiplication/accumulation (MAC) output block included in the PIM device of FIG. 2.

FIG. 7 is a schematic view illustrating a configuration of the MAC output block 240 included in the MAC operator 200 of the PIM device 10-1 shown in FIG. 2. Referring to FIG. 7, the MAC output block 240 may receive the addition result data DA_SUM from the adding block 230 of the MAC operator 200. The addition result data DA_SUM may be configured to include the addition data SUM and the carry output data C_OUT outputted from the adder 231 described with reference to FIG. 6. The MAC output block 240 may include a demultiplexer 241, an inverter 242, and an OR gate 243. The demultiplexer 241 may receive the addition result data DA_SUM from the adding block 230. The demultiplexer 241 may have a first output line 257 through which data are outputted and a second output line 258 connected to one input terminal of the OR gate 243. The demultiplexer 241 may output the addition result data DA_SUM to the outside of the MAC output block 240 through the first output line 257 or to the OR gate 243 through the second output line 258 according to the test mode signal TM. In an embodiment, in the test arithmetic mode (i.e., in case that the test mode signal TM has the first level corresponding to a logic "high" level), the demultiplexer 241 may output the addition result data DA_SUM to the OR gate 243 through the second output line 258. In contrast, in the normal arithmetic mode (i.e., in case that the test mode signal TM has the second level corresponding to a logic "low" level), the demultiplexer 241 may output the addition result data DA_SUM to the outside of the MAC output block 240 through the first output line 257.

The OR gate 243 may receive the addition result data DA_SUM outputted from the demultiplexer 241 and an output signal of the inverter 242 in the test arithmetic mode. The inverter 242 may receive the test mode signal TM and may inversely buffer the test mode signal TM to output the inversely buffered signal of the test mode signal TM. In the test arithmetic mode, a signal transmitted from the inverter 242 to the OR gate 243 may have the second level (i.e., a logic "high" level) because the test mode signal TM has the first level (i.e., a logic "low" level). Because the output signal of the inverter 242 maintains the second level (i.e., a logic "high" level) while the PIM device 10-1 operates in the test arithmetic mode, test data DA_TEST corresponding to an output signal of the OR gate 243 may be determined by the addition result data DA_SUM. As described with reference to FIGS. 5 and 6, when the multiplying block 220 normally operates, the addition result data DA_SUM may be generated to have the second level (i.e., a logic "low" level) and the test data DA_TEST having the second level (i.e., a logic "low" level) may be outputted from the OR gate 243. In contrast, when the multiplying block 220 abnormally operates, the addition result data DA_SUM may be generated to have the first level (i.e., a logic "high" level) and the test data DA_TEST having the first level (i.e., a logic "high" level) may be outputted from the OR gate 243.

Figure 8:
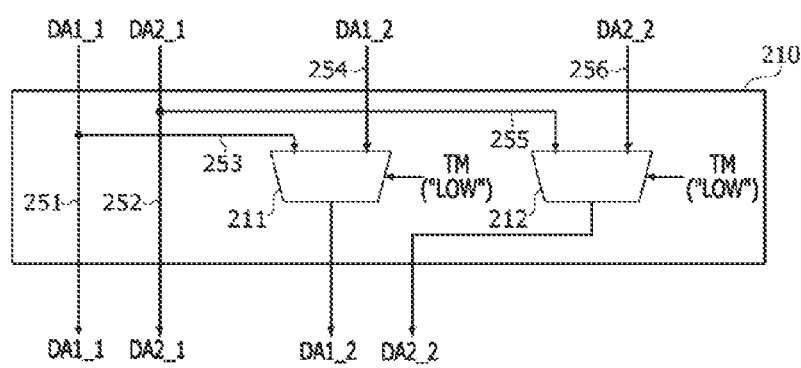
FIGS. 8 to 12 illustrate a MAC mode operation of a PIM device according to an embodiment of the present disclosure.
Figure 9:
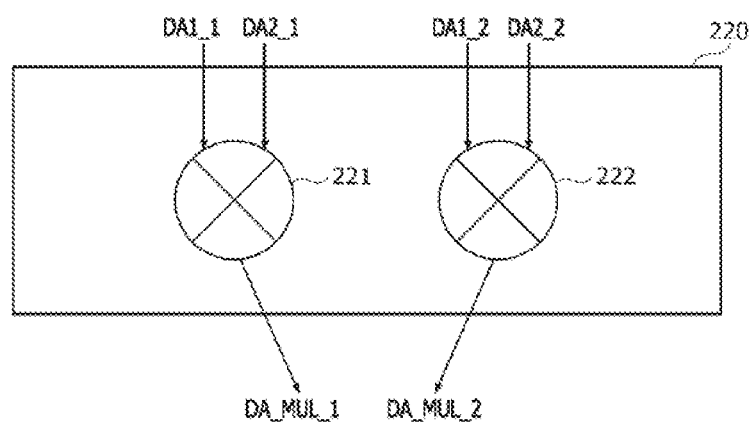

FIGS. 8 to 12 illustrate an operation performed in the normal arithmetic mode of the arithmetic mode of the PIM device 10-1 according to an embodiment of the present disclosure. In the normal arithmetic mode of the PIM device 10-1, the test mode signal TM may have the second level (i.e., a logic "low" level). As illustrated in FIG. 8, the first multiplexer 211 and the second multiplexer 212 of the data input block 210 may receive the test mode signal TM having the second level (i.e., a logic "low" level) to output the second half ('N/2'-bit) data DA1_2 of the first data DA1 and the second half ('N/2'-bit) data DA2_2 of the second data DA2, respectively. Thus, the data input block 210 may output all of the first half ('N/2'-bit) data DA1_1 of the first data DA1, the first half ('N/2'-bit) data DA2_1 of the second data DA2, the second half ('N/2'-bit) data DA1_2 of the first data DA1, and the second half ('N/2'-bit) data DA2_2 of the second data DA2. As illustrated in FIG. 9, the first multiplier 221 of the multiplying block 220 may perform a multiplying calculation of the first half ('N/2'-bit) data DA1_1 of the first data DA1 and the first half ('N/2'-bit) data DA2_1 of the second data DA2 to generate and output the first multiplication result data DA_MUL_1. The second multiplier 222 of the multiplying block 220 may perform a multiplying calculation of the second half ('N/2'-bit) data DA1_2 of the first data DA1 and the second half ('N/2'-bit) data DA2_2 of the second data DA2 to generate and output the second multiplication result data DA_U_2.

Figure 10:
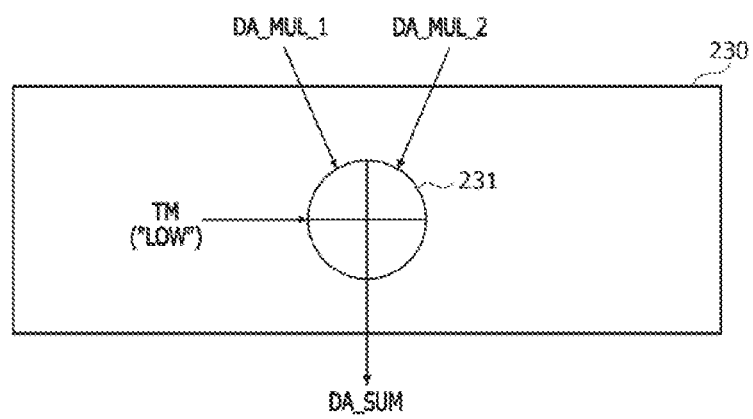
Figure 11:
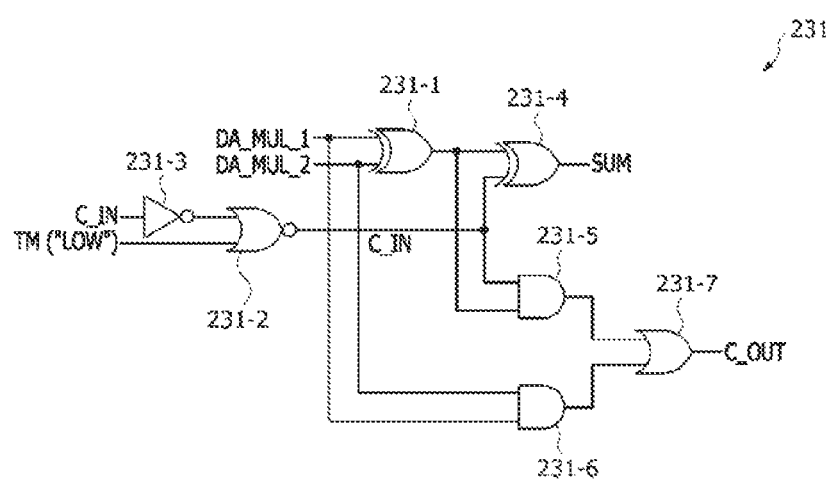
Figure 12:
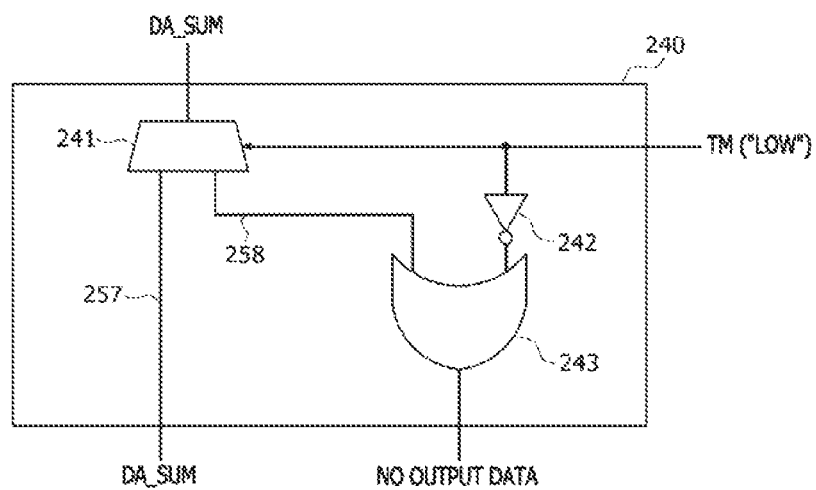

As illustrated in FIG. 10, the adder 231 of the adding block 230 may receive the test mode signal TM having the second level (i.e., a logic "low" level) to perform an adding calculation of the first multiplication result data DA_MUL_1 and the second multiplication result data DA_MUL_2 and to output the addition result data DA_SUM. As illustrated in FIG. 11, because the test mode signal TM having the second level (i.e., a logic "low" level) is inputted to the NOR gate 231-2 of the adder 231, the NOR gate 231-2 may output the carry input signal C_IN. In addition, the adder 231 may act as a full-adder to output a result of the adding calculation of the first multiplication result data DA_MUL_1 and the second multiplication result data DA_MUL_2 as the addition data SUM and the carry output data C_OUT. The addition data SUM and the carry output data C_OUT may constitute the addition result data DA_SUM. As illustrated in FIG. 12, the demultiplexer 241 of the MAC output block 240 may output the addition result data DA_SUM through the first output line 257 in response to the test mode signal TM having the second level (i.e., a logic "low" level). In such a case, no output signal is generated from the OR gate 243.

Figure 13:
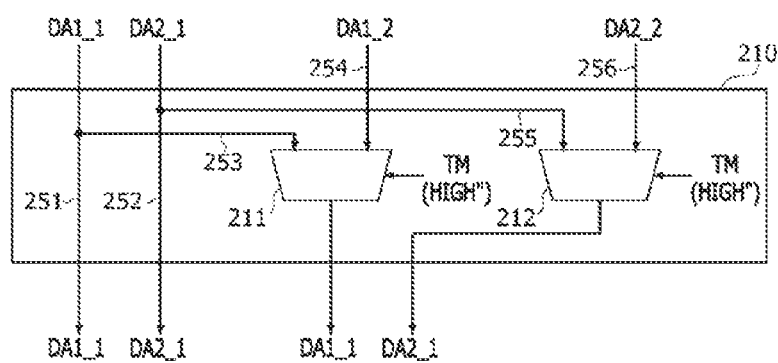
FIGS. 13 to 17 illustrate a test mode operation for a multiplying block included in a PIM device according to an embodiment of the present disclosure.
Figure 14:
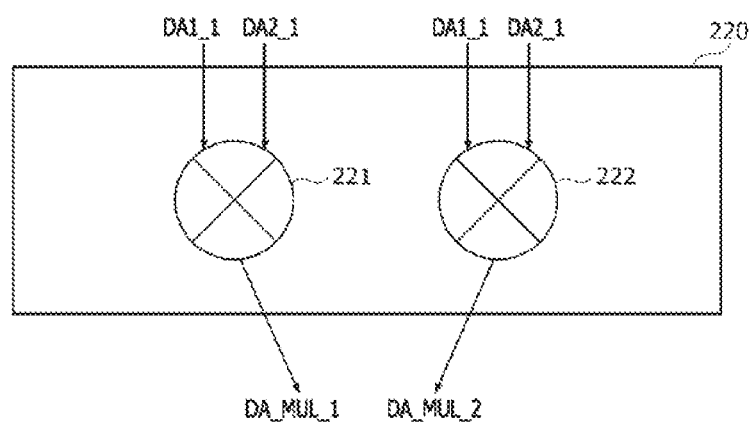

FIGS. 13 to 17 illustrate an operation performed in the test arithmetic mode of the arithmetic mode of the PIM device 10-1 according to an embodiment of the present disclosure. In the test arithmetic mode of the PIM device 10-1, the test mode signal TM may have the first level (i.e., a logic "high" level). As illustrated in FIG. 13, the first multiplexer 211 and the second multiplexer 212 of the data input block 210 may receive the test mode signal TM having the first level (i.e., a logic "high" level) to output the first half ('N/2'-bit) data DA1_1 of the first data DA1 and the first half ('N/2'-bit) data DA2_1 of the second data DA2, respectively. Thus, the data input block 210 may output a pair of the first half ('N/2'-bit) data DA1_1 of the first data DA1 and a pair of the first half ('N/2'-bit) data DA2_1 of the second data DA2. As illustrated in FIG. 14, the first multiplier 221 of the multiplying block 220 may perform a multiplying calculation of the first half ('N/2'-bit) data DA1_1 of the first data DA1 and the first half ('N/2'-bit) data DA2_1 of the second data DA2 to generate and output the first multiplication result data DA_MUL_1. The second multiplier 222 of the multiplying block 220 may also perform a multiplying calculation of the first half ('N/2'-bit) data DA1_1 of the first data DA1 and the first half ('N/2'-bit) data DA2_1 of the second data DA2 to generate and output the second multiplication result data DA_MUL_2.

Figure 15:
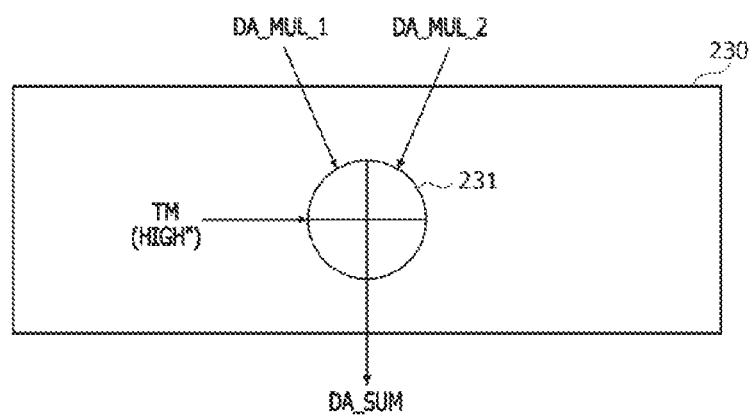
Figure 16:
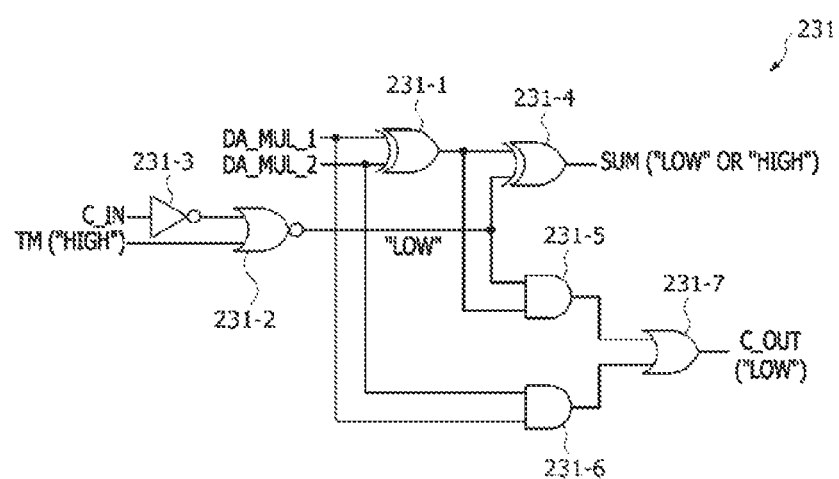

As illustrated in FIG. 15, the adder 231 of the adding block 230 may receive the test mode signal TM having the first level (i.e., a logic "high" level) to perform an exclusive OR operation of the first multiplication result data DA_MUL_1 and the second multiplication result data DA_MUL_2 and to output the addition result data DA_SUM. As illustrated in FIG. 16, because the test mode signal TM having the first level (i.e., a logic "high" level) is inputted to the NOR gate 231-2 of the adder 231, the NOR gate 231-2 may output a signal having the second level (i.e., a logic "low" level) regardless of a level of the carry input signal C_IN. The second exclusive OR gate 231-4 may output the addition data SUM having the first level (i.e., a logic "high" level) or the second level (i.e., a logic "low" level) according to levels of the first multiplication result data DA_MUL_1 and the second multiplication result data DA_MUL_2. When the first multiplication result data DA_MUL_1 and the second multiplication result data DA_MUL_2 have the same level, the second exclusive OR gate 231-4 may output the addition data SUM having the second level (i.e., a logic "low" level). When the first multiplication result data DA_MUL_1 and the second multiplication result data DA_MUL_2 have different levels, the second exclusive OR gate 231-4 may output the addition data SUM having the first level (i.e., a logic "high" level). The OR gate 231-7 may generate and output the carry output data C_OUT having the second level (i.e., a logic "low" level).

Figure 17:
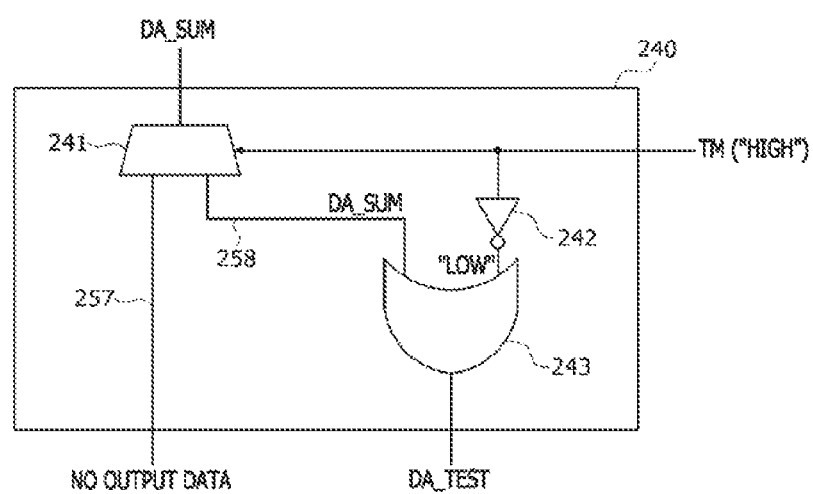

As illustrated in FIG. 17, the demultiplexer 241 of the MAC output block 240 may output the addition result data DA_SUM to one input terminal of the OR gate 243 through the second output line 258 in response to the test mode signal TM having the first level (i.e., a logic "high" level). An inverted signal (having the second level corresponding to a logic "low" level) of the test mode signal TM having the first level (i.e., a logic "high" level) may be inputted to the other input terminal of the OR gate 243. Thus, the OR gate 243 may output the test data DA_TEST having the same level as the addition result data DA_SUM. In such a case, no signal is outputted through the first output line 257 of the MAC output block 240. When the test data DA_TEST has the first level (i.e., a logic "high" level), the multiplying calculations performed by the multiplying block 220 may be regarded as abnormal multiplying calculations. In contrast, when the test data DA_TEST has the second level (i.e., a logic "low" level), the multiplying calculations performed by the multiplying block 220 may be regarded as normal multiplying calculations.

Figure 18:
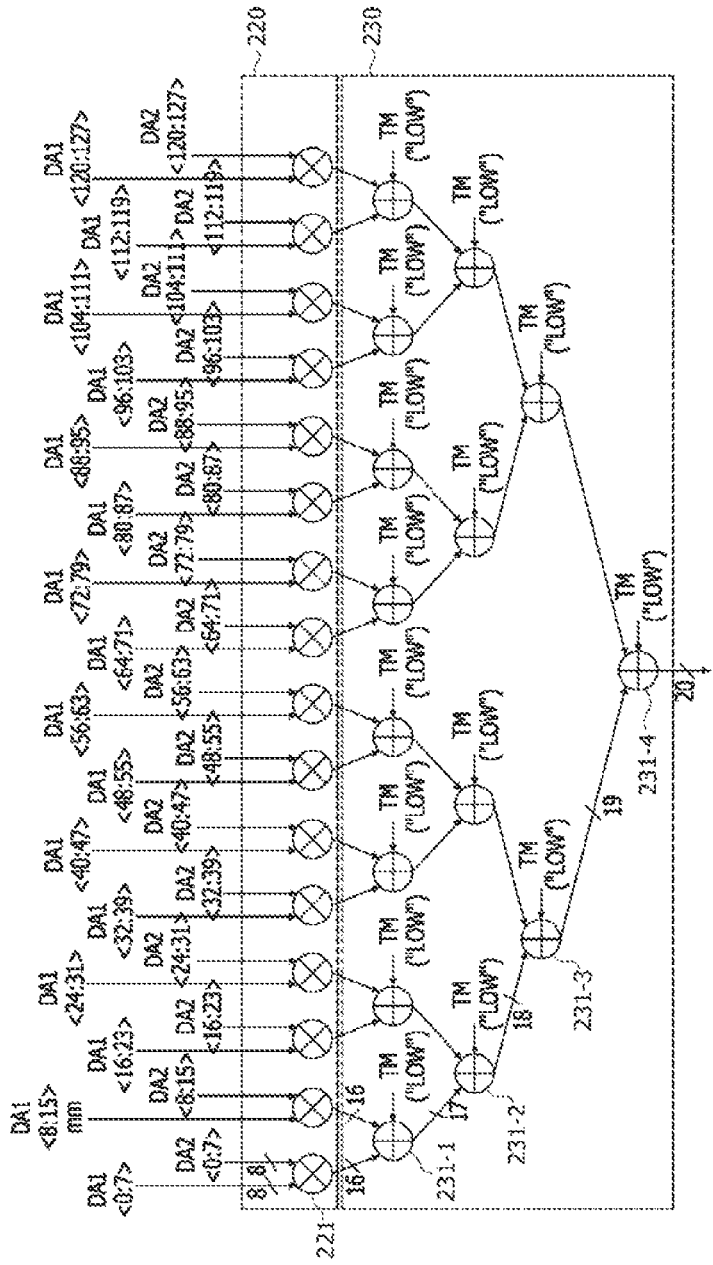
FIG. 18 illustrates operations of a multiplying block and an adding block in a MAC mode of a PIM device according to an embodiment of the present disclosure.
Figure 19:
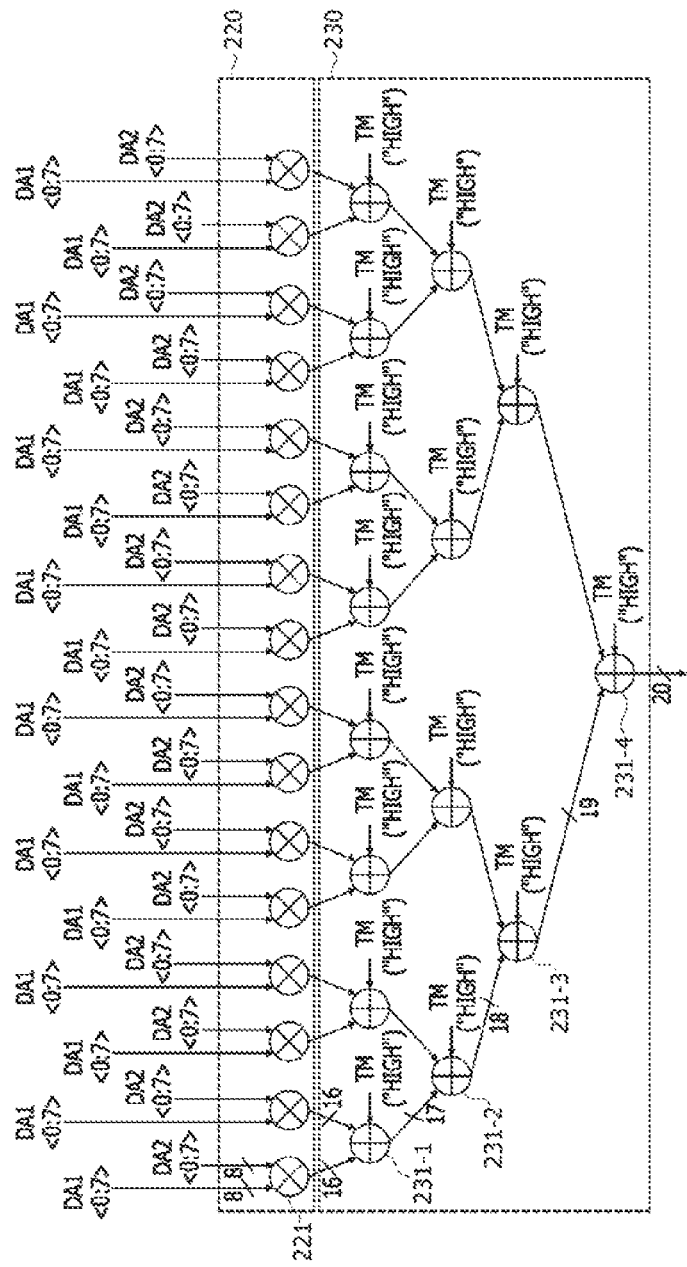
FIG. 19 illustrates operations of a multiplying block and an adding block in a test mode of a PIM device according to an embodiment of the present disclosure.

FIG. 18 illustrates operations of the multiplying block 220 and the adding block 230 in the normal arithmetic mode of the arithmetic mode of the PIM device 104 according to an embodiment of the present disclosure. FIG. 19 illustrates operations of the multiplying block 220 and the adding block 230 in the test arithmetic mode of the arithmetic mode of the PIM device 10-1 according to an embodiment of the present disclosure. The MAC operator (200 of FIG. 2) of the PIM device 10-1 may include a plurality of multipliers 221 constituting the multiplying block 220 and a plurality of adders 231-1, 231-2, 231-3, and 231-4 constituting the adding block 230. The adders 231-1, 231-2, 231-3, and 231-4 may be disposed at respective ones of a plurality of stages to form a tree structure.

In the present embodiment, it may be assumed that each of the first data DA1 and the second data DA2 have 128 bits and the burst length is 8 bits. In such a case, the number of multipliers 221 constituting the multiplying block 220 may be 16. Each of the multipliers 221 may receive 8-bit data of the first data DA1 and 8-bit data of the second data DA2. Each of the multipliers 221 may execute a multiplying calculation of 8-bit data of the first data DA1 and 8-bit data of the second data DA2 to generate and output 16-bit multiplication result data. Because the number of multipliers 221 is 16, 256-bit multiplication result data may be generated by and outputted through all of the multipliers 221.

Each of the eight adders 231-1 disposed at a first stage may receive two sets of the 16-bit data outputted from two of the multipliers 221 to execute an adding calculation of the two sets of the 16-bit data. Each of the eight adders 231-1 disposed at the first stage may generate and output 17-bit addition data including one-bit carry as a result of the adding calculation. Each of the four adders 231-2 disposed at a second stage may receive two sets of the 17-bit addition data outputted from two of the eight adders 231-1 to execute an adding calculation of the two sets of the 17-bit addition data. Each of the four adders 231-2 disposed at the second stage may generate and output 18-bit addition data including one-bit carry as a result of the adding calculation.

Each of the two adders 231-3 disposed at a third stage may receive two sets of the 18-bit addition data outputted from two of the four adders 231-2 to execute an adding calculation of the two sets of the 18-bit addition data. Each of the two adders 231-3 disposed at the third stage may generate and output 19-bit addition data including one-bit carry as a result of the adding calculation. Finally, the adder 231-4 disposed at a last stage (i.e., a fourth stage) may receive two sets of the 19-bit addition data outputted from the two adders 231-3 to execute an adding calculation of the two sets of the 19-bit addition data. The adder 231-4 disposed at the fourth stage may generate and output 20-bit addition result data including one-bit carry as a result of the adding calculation.

As illustrated in FIG. 18, in the normal arithmetic mode of the arithmetic mode of the PIM device 10-1, the test mode signal TM having the second level (i.e., a logic "low" level) may be inputted to each of the fifteen adders 231-1, 231-2, 231-3, and 231-4. In addition, each of the sixteen multipliers 221 constituting the multiplying block 220 may receive 8-bit data of the first data DA1 and 8-bit data of the second data DA2 through the data input block 210 of the MAC operator 200. In the normal arithmetic mode, the first data DA1 may be divided by 8-bit data to provide 16 sets of 8-bit data, which are inputted to respective ones of the sixteen multipliers 221. Similarly, in the normal arithmetic mode, the second data DA2 may be divided by 8-bit data to provide 16 sets of 8-bit data, which are inputted to respective ones of the sixteen multipliers 221.

More specifically, a first one of the sixteen multipliers 221 may receive the first data DA1<0:7> including a first bit (corresponding to a least significant bit (LSB)) to an eighth bit of the first data DA1 having 128 bits and the second data DA2<0:7> including a first bit (corresponding to a least significant bit (LSB)) to an eighth bit of the second data DA2 having 128 bits. A second one of the sixteen multipliers 221 may receive the first data DA1<8:15> including a ninth bit to a sixteenth bit of the first data DA1 having 128 bits and the second data DA2<8:15> including a ninth bit to a sixteenth bit of the second data DA2 having 128 bits. In the same way, a sixteenth one of the sixteen multipliers 221 may receive the first data DA1<120:127> including a $121^{th}$ bit to a $128^{th}$ bit (corresponding to a most significant bit (MSB)) of the first data DA1 having 128 bits and the second data DA2<120:127> including a $121^{th}$ bit to a $128^{th}$ bit (corresponding to a most significant bit (MSB)) of the second data DA2 having 128 bits.

Each of the sixteen multipliers 221 may execute a multiplying calculation of 8-bit data of the first data DA1 and 8-bit data of the second data DA2 to generate and output 16-bit multiplication result data. Because the number of multipliers 221 is 16, 256-bit multiplication result data may be generated by and outputted through all of the multipliers 221. In the normal arithmetic mode, each of the fifteen adders 231-1, 231-2, 231-3, and 231-4 constituting the adding block 230 may act as a full-adder because the test mode signal TM has the second level (i.e., a logic "low" level). Thus, the adding calculations in the first to fourth stages may be sequentially performed to finally generate and output 20-bit addition result data through the adder 231-4.

Next, as illustrated in FIG. 19, the test mode signal TM having the first level (i.e., a logic "high" level) may be inputted to each of the fifteen adders 231-1, 231-2, 231-3, and 231-4 in the test arithmetic mode of the arithmetic mode of the PIM device 10-1. In addition, each of the sixteen multipliers 221 constituting the multiplying block 220 may receive 8-bit data of the first data DA1 and 8-bit data of the second data DA2 through the data input block 210 of the MAC operator 200. In the test arithmetic mode, the first 8-bit data inputted to respective ones of the sixteen multipliers 221 may be the same data by the data input block 210. Similarly, in the test arithmetic mode, the second 8-bit data inputted to respective ones of the sixteen multipliers 221 may be the same data by the data input block 210. In an embodiment, each of the sixteen multipliers 221 may receive the first 8-bit data DA1<0:7> including a first bit (corresponding to a least significant bit (LSB)) to an eighth bit of the first data DA1 having 128 bits and the second 8-bit data DA2<0:7> including a first bit (corresponding to a least significant bit (LSB)) to an eighth bit of the second data DA2 having 128 bits.

Each of the sixteen multipliers 221 may execute a multiplying calculation of the first 8-bit data DA1<0:7> and the second 8-bit data DA2<0:7> to generate and output 16-bit multiplication result data. In the test arithmetic mode, all of the sixteen multipliers 221 may output the same multiplication result data having 16 bits because all of the sixteen multipliers 221 receive the same input data to perform the same multiplying calculation. In the test arithmetic mode, each of the fifteen adders 231-1, 231-2, 231-3, and 231-4 constituting the adding block 230 may act as an exclusive OR gate because the test mode signal TM has the first level (i.e., a logic "high" level). Thus, the adding calculations in the first to fourth stages may be sequentially performed to finally generate and output 20-bit test result data through the adder 231-4.

Figure 20:
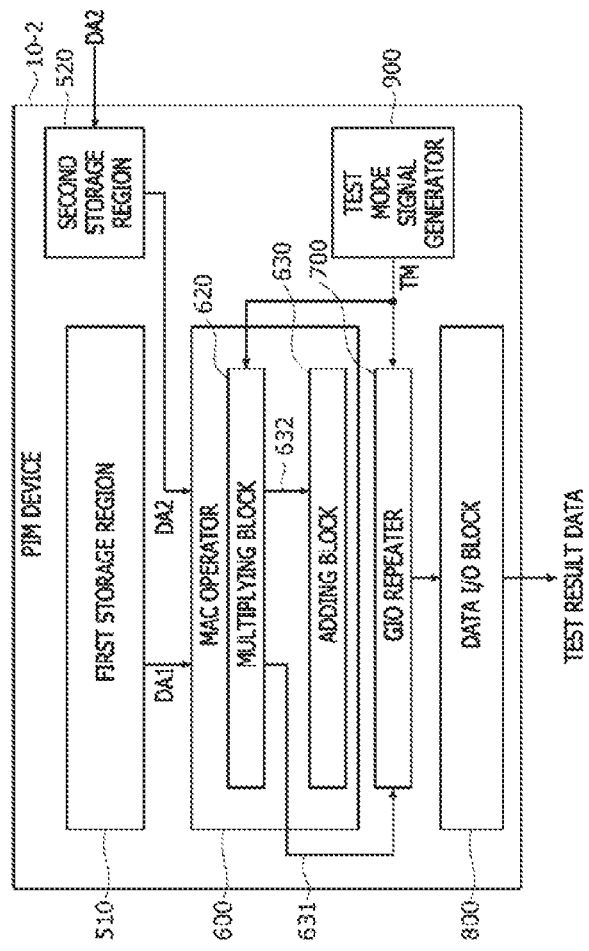
FIG. 20 is a block diagram illustrating a configuration of a PIM device according to another embodiment of the present disclosure.

FIG. 20 is a block diagram illustrating a configuration of an PIM device 10-2 according to another embodiment of the present disclosure. Referring to FIG. 20, the PIM device 10-2 may be configured to include a first storage region 510, a second storage region 520, a MAC operator 600, a global input/output (GIO) repeater 700, a data I/O block 800, and a test mode signal generator 900. In an embodiment, the PIM device 10-2 may be applied to a neural network circuit. In such a case, vector data necessary to neural network calculation may be stored in the first storage region 510, and weight data may be temporarily stored in the second storage region 520. In an embodiment, while the first storage region 510 may be a memory region (e.g., a bank) of the PIM device 10-2, the second storage region 520 may be a buffer memory which is distinguished from the memory region (e.g., a bank) of the PIM device 10-2. In an embodiment, the first storage region 510 may be realized using a volatile memory device such as a DRAM device or an SRAM device. In another embodiment, the first storage region 510 may be realized using a nonvolatile memory device. In yet another embodiment, the first storage region 510 may be realized to include both of a volatile memory device and a nonvolatile memory device.

The MAC operator 600 may perform a MAC calculation in an arithmetic mode of the PIM device 10-2. That is, the MAC operator 600 may perform a MAC calculation of first data DA1 outputted from the first storage region 510 and second data DA2 outputted from the second storage region 520 in the arithmetic mode of the PIM device 10-2. The MAC operator 600 does not perform any MAC calculation in a memory mode of the PIM device 10-2. That is, in the memory mode of the PIM device 10-2, the PIM device 10-2 may function as a general memory device, Thus, in the memory mode of the PIM device 10-2, the PIM device 10-2 may store write data into the first storage region 510 or may read out read data from the first storage region 510 to output the read data to an external device.

In an embodiment, the MAC operator 600 may include a multiplying block 620 and an adding block 630. The multiplying block 620 may receive the first data DA1 from the first storage region 510 and the second data DA2 from the second storage region 520. The multiplying block 620 may have a first output line 631 and a second output line 632. The multiplying block 620 may perform a multiplying calculation of the first data DA1 and the second data DA2 to output the multiplication result data to the GIO repeater 700 through the first output line 631. Alternatively, the multiplying block 620 may perform a multiplying calculation of the first data DA1 and the second data DA2 to output the multiplication result data to the adding block 630 through the second output line 632. The multiplying block 620 may select one of the first and second output lines 631 and 632 in response to a test mode signal TM. In an embodiment, when the test mode signal TM having a first level (i.e., a logic "high" level) is inputted to the multiplying block 620, the multiplying block 620 may operate in a test arithmetic mode to transmit the multiplication result data to the GIO repeater 700 through the first output line 631. In contrast, when the test mode signal TM having a second level (i.e., a logic "low" level) is inputted to the multiplying block 620, the multiplying block 620 may operate in a normal arithmetic mode to transmit the multiplication result data to the adding block 630 through the second output line 632. The adding block 630 may perform adding calculations of the multiplication result data outputted from the multiplying block 620 to output a result of the adding calculations as addition result data in the normal arithmetic mode.

In the test arithmetic mode, the GIO repeater 700 may transmit the multiplication result data outputted from the multiplying block 620 to the data I/O block 800 in response to the test mode signal TM having the first level (i.e., a logic "high" level). The GIO repeater 700 may control data transmission of GIO lines which are used to transmit write data to the first region storage 510 or to transmit read data outputted from the first storage region 510. In an embodiment, the first data DA1 outputted from the first storage region 510 may be transmitted to the MAC operator 600 through the GIO lines selected by the GIO repeater 700 in the normal arithmetic mode and the test arithmetic mode of the PIM device 10-2. The multiplication result data outputted from the multiplying block 620 may be directly transmitted to the data I/O block 800 through the GIO lines selected by the GIO repeater 700 in the test arithmetic mode of the PIM device 10-2.

The data I/O block 800 may transmit external data inputted through pads of the PIM device 10-2 to the GIO lines of the PIM device 10-2 or may output internal data transmitted through the GIO lines to an external device through the pads of the PIM device 10-2. Thus, logical malfunction of the multiplying block 620 of the MAC operator 600 may be verified by the multiplication result data outputted from the PIM device 10-2.

The test mode signal generator 900 may generate the test mode signal TM having the first level (e.g., a logic "high" level) during a test operation for the multiplying block 620 of the MAC operator 600. In contrast, the test mode signal generator 900 may generate the test mode signal TM having the second level (e.g., a logic "low" level) during the normal arithmetic mode which is not the test mode. The test mode signal TM outputted from the test mode signal generator 900 may be inputted to the multiplying block 620 and the GIO repeater 700. In an embodiment, when the test mode signal TM having the first level (i.e., a logic "high" level) is inputted to the multiplying block 620 of the MAC operator 600, the multiplication result data outputted from the multiplying block 620 may be transmitted to the GIO repeater 700 through the first output line 631 and the GIO repeater 700 may transmit the multiplication result data to the data I/O block 800. In contrast, when the test mode signal TM having the second level (i.e., a logic "low" level) is inputted to the multiplying block 620 of the MAC operator 600, the multiplication result data outputted from the multiplying block 620 may be transmitted to the adding block 630 of the MAC operator 600 through the second output line 632 and the GIO repeater 700 may transmit the first data DA1 outputted from the first storage region 510 to the MAC operator 600 through the GIO lines.

Figure 21:
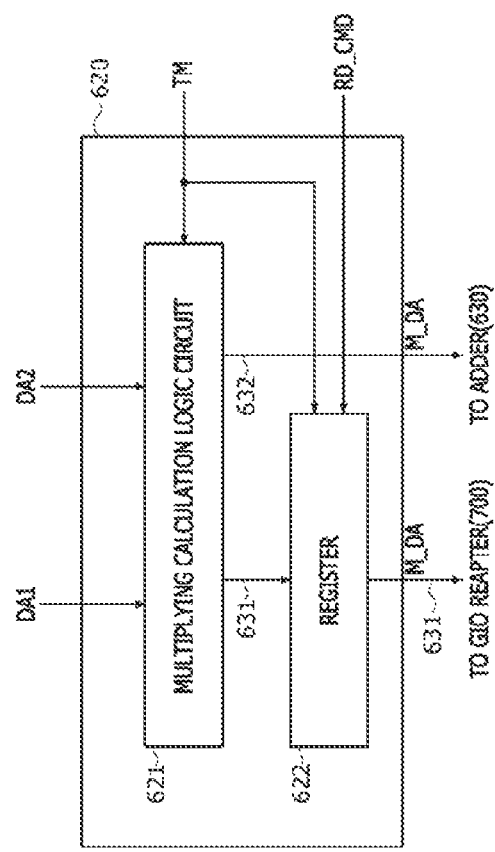
FIG. 21 is a block diagram illustrating a configuration of a multiplying block included in the PIM device of FIG. 20.

FIG. 21 is a block diagram illustrating a configuration of the multiplying block 620 included in the PIM device 10-2 of FIG. 20, Referring to FIG. 21, the multiplying block 620 may be configured to include a multiplying calculation logic circuit 621 and a register 622. The multiplying calculation logic circuit 621 may receive the first data DA1 and the second data DA2 and may perform a multiplying calculation of the first data DA1 and the second data DA2 to generate and output multiplication result data M_DA. The multiplying calculation logic circuit 621 may output the multiplication result data M_DA to the register 611 through the first output line 631 in response to the test mode signal TM having the first level (i.e., a logic "high" level). The multiplying calculation logic circuit 621 may output the multiplication result data MDA to the adding block 630 through the second output line 632 in response to the test mode signal TM having the second level (i.e., a logic "low" level).

The register 622 may store the multiplication result data M_DA outputted from the multiplying calculation logic circuit 621 through the first output line 631, in response to the test mode signal TM having the first level (i.e., a logic "high" level). In addition, the register 622 may transmit the multiplication result data M_DA stored therein to the GIO repeater 700 through the first output line 631, in response to a read command RD_CMD. In an embodiment, the read command RD_CMD may be provided by an external device.

Figure 22:
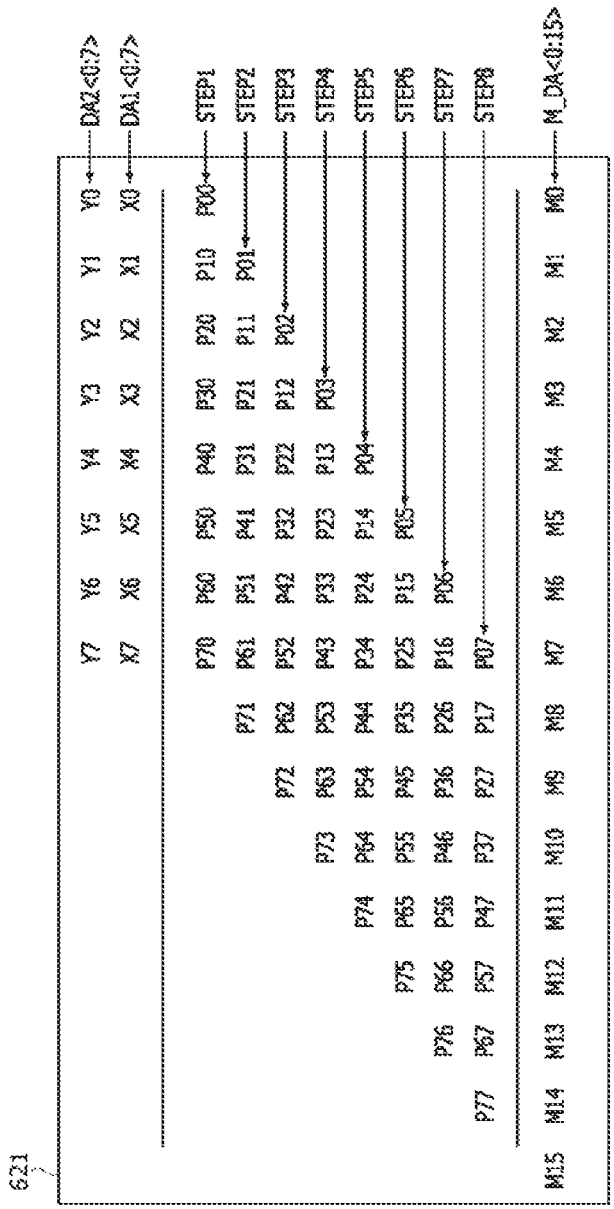
FIG. 22 is a schematic view illustrating a calculation process executed by a multiplying calculation logic circuit included in the multiplying block of FIG. 21.

FIG. 22 is a schematic view illustrating a calculation process executed by the multiplying calculation logic circuit 621 included in the multiplying block 620 of FIG. 21. The present embodiment will be described in conjunction with a case that the multiplying calculation logic circuit 621 receives 8-bit binary data of 'X7 X6 X5 X4 X3 X2 X1 X0" as the first 8-bit data DA1<0:7> and 8-bit binary data of "Y7 Y6 Y5 Y4 Y3 Y2 Y1 Y0" as the second 8-bit data DA2<0:7>. As illustrated in FIG. 22, the multiplying calculation of the first 8-bit data DA1<0:7> and the second 8-bit data DA2<0:7> may include shifting calculations of first to eighth steps STEP1-STEP8 and a final adding calculation. Data "P70 P60 P50 P40 P30 P20 P10 P00" corresponding to result data of the first step STEP1 may be the same as the second 8-bit data DA2<0:7> when the first bit "X0" corresponding to a least significant bit (LSB) of the first 8-bit data DA1<0:7> has a value of "1," and all of bits included in the data "P70 P60 P50 P40 P30 P20 P10 P00" corresponding to the result data of the first step STEP1 may have a value of "0" when the first bit "X0" corresponding to the LSB of the first 8-bit data DA1<0:7> has a value of "0." Data "P71 P61 P51 P41 P31 P21 P11 P01" corresponding to result data of the second step STEP2 may be located to be shifted by one bit from a position of the data "P70 P60 P50 P40 P30 P20 P10 P00" in a direction of a most significant bit (MSB) of the data "P70 P60 P50 P40 P30 P20 P10 P00." In such a case, the data "P71 P61 P51 P41 P31 P21 P11 P01" may be the same as the second 8-bit data DA2<0:7> when the second bit "X1" of the first 8-bit data DA1<0:7> has a value of "1," and all of bits included in the data "P71 P61 P51 P41 P31 P21 P11 P01" may have a value of "0" when the second bit "X1" of the first 8-bit data DA1<0:7> has a value of "0."

Similarly, data "P72 P62 P52 P42 P32 P22 P12 P02" corresponding to result data of the third step STEP3 may be located to be shifted by two bits from a position of the data "P70 P60 P50 P40 P30 P20 P10 P00" in a direction of the MSB of the data "P70 P60 P50 P40 P30 P20 P10 P00." In such a case, the data "P72 P62 P52 P42 P32 P22 P12 P02" may be the same as the second 8-bit data DA2<0:7> when the third bit "X2" of the first 8-bit data DA1<0:7> has a value of "1," and all of bits included in the data "P72 P62 P52 P42 P32 P22 P12 P02" may have a value of "0" when the third bit "X2" of the first 8-bit data DA1<0:7> has a value of "0." In the same way, data "P77 P67 P57 P47 P37 P27 P17 P07" corresponding to result data of the eighth step STEP8 may be located to be shifted by seven bits from a position of the data "P70 P60 P50 P40 P30 P20 P10 P00" in a direction of the MSB of the data "P70 P60 P50 P40 P30 P20 P10 P00." In such a case, the data "P77 P67 P57 P47 P37 P27 P17 P07" may be the same as the second 8-bit data DA2<0:7> when the eighth bit "X7" corresponding to the MSB of the first 8-bit data DA1<0:7> has a value of "1," and all of bits included in the data "P77 P67 P57 P47 P37 P27 P17 P07" may have a value of "0" when the eighth bit "X7" of the first 8-bit data DA1<0:7> has a value of "0." After all of the shifting calculations of the first to eighth steps STEP1-STEP8 are executed, the multiplying calculation logic circuit 621 may add all of the result data of the first to eighth steps STEP1-STEP8 to output 16-bit multiplication result data M_DA<0:15> of "M15 M14 M13 M12 M11 M10 M9 M8 M7 M6 M5 M4 M3 M2 M1 M0."

Figure 23:
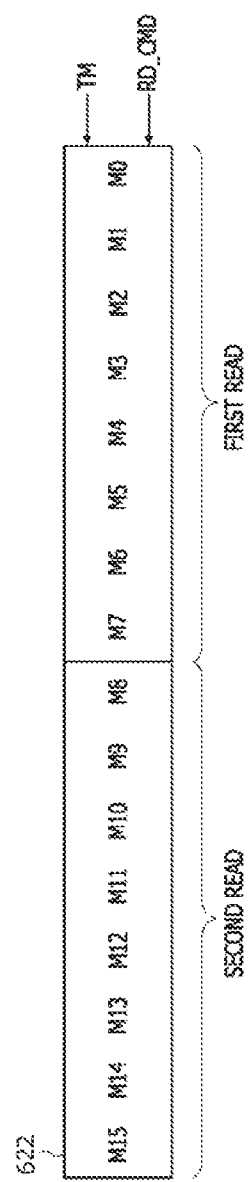
FIG. 23 is a schematic view illustrating a storage operation and an output operation of a register included in the multiplying block of FIG. 21.

FIG. 23 is a schematic view illustrating a storage operation and an output operation of the register 622 included in the multiplying block 620 of FIG. 21. As described with reference to FIG. 21, the multiplication result data M_DA<0:15> outputted from the multiplying calculation logic circuit 621 by the test mode signal TM having the first level (i.e., a logic "high" level) in the test arithmetic mode may be transmitted to the register 622 through the first output line 631. As illustrated in FIG. 23, the register 622 may store the multiplication result data M_DA<0:15> in response to the test mode signal TM having the first level (i.e., a logic "high" level) and may output the stored multiplication result data M_DA<0:15> in response to the read command RD_CMD. The multiplication result data M_DA<0:15> stored in the register 622 may be outputted at a time when the read command RD_CMD is inputted to the register 622 once. However, when the burst length is less than the number of bits included in the multiplication result data M_DA<0:15>, the multiplication result data M_DA<0:15> may be outputted while the read command RD_CMD is inputted to the register 622 at least twice. For example, when the burst length is set to be '8' with the multiplication result data M_DA<0:15> having 16 bits, low-order 8-bit data 'M7 M6 M5 M4 M3 M2 M1 M0' of the multiplication result data M_DA<0:15> may be outputted when the read command RD_CMD is inputted to the register 622 a first time and high-order 8-bit data 'M15 M14 M13 M12 M11 M10 M9 M8' of the multiplication result data M_DA<0:15> may be outputted when the read command RD_CMD is inputted to the register 622 a second time.

Figure 24:
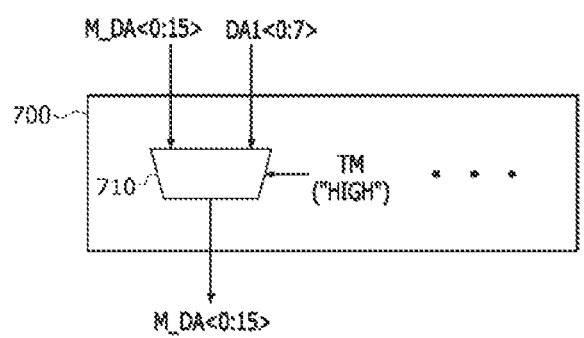
FIG. 24 is a schematic view illustrating a configuration of a GIO repeater included in the PIM device of FIG. 20.

FIG. 24 is a schematic view illustrating a configuration of the GIO repeater 700 included in the PIM device 10-2 of FIG. 20, Referring to FIG. 23, the GIO repeater 700 may include a plurality of multiplexers 710. The multiplexer 710 may receive the multiplication result data M_DA<0:15> outputted from the multiplying block 620 of the MAC operator 600 and the first 8-bit data DA1<0:7> read out of the first storage region 510. The multiplexer 710 may output the multiplication result data M_DA<0:15> or the first 8-bit data DA1<0:7> according to a level of the test mode signal TM. When the test mode signal TM having the first level (i.e., a logic "high" level) is inputted to the multiplexer 710 in the test arithmetic mode, the multiplexer 710 may output the multiplication result data M_DA<0:15>. In contrast, although not shown in FIG. 24, when the test mode signal TM having the second level (i.e., a logic "low" level) is inputted to the multiplexer 710, the multiplexer 710 may output the first 8-bit data DA1<0:7>. Thus, the test arithmetic mode of the PIM device 10-2 may be activated after the first data DA1 stored in the first storage region 510 are inputted to the MAC operator 600. That is, after the first data DA1 stored in the first storage region 510 are inputted to the MAC operator 600 by the GIO repeater 700, a level of the test mode signal TM may be changed from the second level (i.e., a logic "low" level) into the first level (i.e., a logic "high" level).

According to the embodiments described above, a logical operation of a MAC operator may be tested using a test mode signal. In addition, the malfunction of a multiplying block may be detected by directly outputting multiplication result data of the MAC operator to an external device.

A limited number of possible embodiments for the present teachings have been presented above for illustrative purposes, Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment, Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A processing-in-memory (PIM) device including a multiplication/accumulation (MAC) operator integrated in a memory device, the MAC operator comprising:
    a multiplying block including a first multiplier and a second multiplier, wherein the first multiplier is configured to perform a first multiplying calculation of data input to two first input terminals of the first multiplier, wherein first half data of first data and first half data of second data are inputted to respective ones of the two first input terminals, and the second multiplier is configured to perform a second multiplying calculation of data input to two second input terminals of the second multiplier, wherein second half data of the first data and second half data of the second data which are inputted to respective ones of the two second input terminals; and
    an adding block configured to perform an adding calculation of first multiplication result data outputted from the first multiplier and second multiplication result data outputted from the second multiplier,
    wherein the MAC operator is configured to receive a test mode signal having a first level to perform a test operation for the multiplying block by inputting the first half data of the first data and the first half data of the second data to respective ones of the two first input terminals and to respective ones of the two second input terminals and by executing the first multiplying calculation, the second multiplying calculation, and the adding calculation.

2. The PIM device of claim 1,
    wherein the MAC operator further comprises a data input block,
    wherein the data input block is configured to receive the first half data of first data, the first half data of second data, the second half data of the first data, and the second half data of the second data, and
    wherein the data input block is configured to output the first half data of first data and the first half data of second data in response to the test mode signal having the first level.

3. The PIM device of claim 1,
    wherein the MAC operator further comprises a data input block,
    wherein the data input block includes:
        a first input/output (I/O) line through which the first half data of the first data are transmitted;
        a second I/O line through which the first half data of the second data are transmitted;
        a first multiplexer configured to output the first half data of the first data or the second half data of the first data according to the test mode signal; and
        a second multiplexer configured to output the first half data of the second data or the second half data of the second data according to the test mode signal.

4. The PIM device of claim 3,
    wherein the first multiplexer is configured to output the first half data of the first data in response to the test mode signal having the first level; and
    wherein the second multiplexer is configured to output the first half data of the second data in response to the test mode signal having the first level.

5. The PIM device of claim 4,
    wherein the two first input terminals of the first multiplier are coupled to the first I/O line and the second I/O line, respectively; and
    wherein the two second input terminals of the second multiplier are coupled to an output terminal of the first multiplexer and an output terminal of the second multiplexer, respectively.

6. The PIM device of claim 1, wherein the adding block includes an adder configured to perform an exclusive OR operation of output data of the first multiplier and output data of the second multiplier to output a result of the exclusive OR operation, in response to the test mode signal having the first level.

7. The PIM device of claim 6, wherein the adder is configured to perform an adding calculation of the output data of the first multiplier and the output data of the second multiplier to output a result of the adding calculation, in response to the test mode signal having a second level.

8. The PIM device of claim 7, wherein the adder includes:
a NOR gate configured to perform a logical NOR operation of the test mode signal and an inverted signal of a carry input signal to output a result of the logical NOR operation;
a first exclusive OR gate configured to perform a first exclusive OR operation of the output data of the first multiplier and the output data of the second multiplier to output a result of the first exclusive OR operation;
a second exclusive OR gate configured to perform a second exclusive OR operation of output data of the NOR gate and output data of the first exclusive OR gate to output a result of the second exclusive OR operation as addition data;
a first AND gate configured to perform a first logical AND operation of the output data of the first exclusive OR gate and the output data of the NOR gate to output a result of the first logical AND operation;
a second AND gate configured to perform a second logical AND operation of the output data of the first multiplier and the output data of the second multiplier to output a result of the second logical AND operation; and
an OR gate configured to perform a logical OR operation of output data of the first AND gate and output data of the second AND gate to output a result of the logical OR operation as carry output data.

9. The PIM device of claim 1, further comprising a MAC output block configured to perform a logical OR operation of MAC result data outputted from the adding block and an inverted signal of the test mode signal to output a result of the logical OR operation, in response to the test mode signal having the first level.

10. The PIM device of claim 9, wherein the MAC output block is configured to output the MAC result data outputted from the adding block as they are, in response to the test mode signal having a second level.

11. The PIM device of claim 9, wherein the MAC output block includes:
a demultiplexer configured to receive the MAC result data and configured to output the MAC result data through one of a first output line and a second output line according to the test mode signal;
an inverter configured to invert the test mode signal to output an inverted signal of the test mode signal; and
an OR gate configured to perform a logic OR operation of the MAC result data outputted from the demultiplexer through the second output line and data outputted from the inverter to output a result of the logic OR operation as test data.

12. A method of testing a processing-in-memory (PIM) device including a multiplication/accumulation (MAC) operator integrated in a memory device, the method comprising:
performing multiplying calculations of different pairs of corresponding portions of first data and second data by a plurality of multipliers included in the MAC operator in a normal arithmetic mode;
generating a test mode signal having a first level for activating a test arithmetic mode;
inputting a same portion of first data and a same portion of second data to each of the plurality of multipliers in response to the test mode signal having the first level, wherein a multiplying calculation of the same portion of first data and the same portion of second data is performed by each of the plurality of multipliers; and
performing an exclusive OR operation of multiplication result data outputted from the plurality of multipliers by an adding block to execute a test operation for the plurality of multipliers in response to the test mode signal having the first level.

13. The method of claim 12, wherein the normal arithmetic mode further comprises:
generating the test mode signal having a second level for activating the normal arithmetic mode;
inputting different portions of the first data to respective ones of first input terminals of the plurality of multipliers and inputting different portions of the second data to respective ones of second input terminals of the plurality of multipliers, in response to the test mode signal having the second level;
performing the multiplying calculations in the normal arithmetic mode; and
performing an adding calculation of multiplication result data outputted from the plurality of multipliers by the adding block in response to the test mode signal having the second level.

* * * * *